United States Patent
Ishii

[11] Patent Number: 6,128,560
[45] Date of Patent: *Oct. 3, 2000

[54] MALFUNCTION DIAGNOSIS SYSTEM AND METHOD FOR ON-VEHICLE ELECTRONIC CONTROL UNITS

[75] Inventor: Satoshi Ishii, Toyota, Japan

[73] Assignee: Toyota Jidosha Kabushiki Kaisha, Toyota, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/810,108

[22] Filed: Feb. 25, 1997

[30] Foreign Application Priority Data

Feb. 26, 1996 [JP] Japan ................................ 8-038243

[51] Int. Cl.[7] .............................. G06F 7/00; G06F 17/00
[52] U.S. Cl. ................... 701/29; 701/33; 340/825.06; 340/825.16
[58] Field of Search ................... 701/29–33, 35; 340/825.65, 825.06, 825.16

[56] References Cited

U.S. PATENT DOCUMENTS

| | | | |
|---|---|---|---|
| 4,484,263 | 11/1984 | Olson et al. | 364/200 |
| 5,034,889 | 7/1991 | Abe | 701/34 |
| 5,739,761 | 4/1998 | Kobayashi | 340/825.16 |

FOREIGN PATENT DOCUMENTS

| | | |
|---|---|---|
| 63-48477 | 3/1988 | Japan . |
| 2-262797 | 10/1990 | Japan . |

*Primary Examiner*—William A. Cuchlinski, Jr.
*Assistant Examiner*—Yonel Beaulieu
*Attorney, Agent, or Firm*—Oliff & Berridge, PLC

[57] ABSTRACT

A diagnosis system for diagnosing malfunctions of on-vehicle electronic control units (ECU) includes a plurality of ECUs and a diagnostic tester. The ECUs are connected to one another, thereby forming a communications network. The ECUs store a data related to malfunctions. A diagnostic tester is connected to an engine ECU for reading the data stored in the ECUs. The tester transmits an initialization signal at a low speed to the ECU when starting communicating with one of the ECUs. The ECU selects a transmission rate between the ECU and the tester based on the initialization signal.

6 Claims, 6 Drawing Sheets

MALFUNCTION DIAGNOSIS SYSTEM AND METHOD FOR ON-VEHICLE ELECTRONIC CONTROL UNITS

BACKGROUND OF THE INVENTION

1. Field of the Invention

The present invention relates to malfunction diagnosis systems for diagnosing malfunctions in electronic control units and devices connected thereto on vehicles. More particularly, the present invention relates to a malfunction detection system for electronic control units that are connected with one another by a communications network.

2. Description of the Related Art

Various functions of vehicles are often electronically controlled. This type of vehicle employs electronic control units (ECU). ECUs are categorized as engine control ECUs, transmission control ECUs, antilock brake system (ABS) ECUs and others. Each ECU sends command signals to the corresponding device for controlling it. Inspection is conducted before shipping to judge whether the ECUs are functioning normally. Each ECU stores data regarding the device it controls. The data stored in ECUs allows the cause of vehicle malfunctions to be diagnosed.

The diagnosis of the ECUs is generally performed by an external vehicle diagnostic tester. The diagnostic tester is connected to communication ports of each ECU, through which each ECU and the diagnostic tester exchange data. In prior art systems, the transmission rate is as slow as 125 bit/sec (bps). Since the CPU incorporated in an ECU can read the data at this rate, the ECU needs no communication ICs to be incorporated therein.

However, recent data transmissions are performed at faster transmission rates. The California Air Resources Board (CARB) requires 10.4 kbps for diagnosis communications between an external vehicle diagnostic tester and an engine control ECU. At such a high transmission rate, the CPU in an engine ECU cannot read data and therefore needs to have a communications IC.

A plurality of ECUs mounted on a vehicle are often connected with one another, thereby forming a communications network. The ECUs perform mutual data transmissions using the communications network. In Japan, the transmission rate of 9.6 kbps is generally used in the network. An engine ECU that is connected to the network needs to be coordinated to the transmission rate of 9.6 kbps.

As described above, the required transmission rate for the engine ECU is different between the United States and Japan. This increases the development expenses of ECUs and complicates the product control of ECUs. A vehicle manufactured in North America usually has an engine ECU that is compliant with the local standard. When such a vehicle is imported to Japan, its engine ECU cannot be inspected by an external vehicle diagnostic tester that is compliant with the Japanese standard.

Therefore, there is a demand for an engine ECU that is adapted to both 10.4 kbps and 9.6 kbps standards. One way to meet the demand is to provide suitable hardware, that is, an ECU having two communication ICs for two different transmission rates. This increases the manufacturing cost of the ECUs. Another way is to provide an ECU with a single IC having a software program to switch data transmission rates.

An ECU that chooses a data transmission rate by a program performs data transmissions by normal I/O processing until it selects a data transmission rate. If a plurality of ECUs constitute a communications network, a diagnostic tester designates an ECU and establishes a data transmission with it.

The International Organization for Standardization (ISO) recites in ISO9141 that an initialization process for "designation of a desired ECU among others (not a transmission rate selecting method)" be performed at 5 bps, which is fairly slow.

With a transmission rate of 5 bps, it takes about two seconds to transmit one byte of data. The transmission rate is selected after an ECU among ECUs forming a communications network is designated. Therefore, under the ISO standard, selecting of the transmission rate takes a relatively long time. Designation of an ECU can be performed without the ISO standard for speeding the initialization process. However, it is likely that the ECU designating method will be required to comply with ISO standards in the future.

Therefore, there is a demand for a system that designates an ECU based on the ISO standards and selects the transmission rate for data transmission with the designated ECU. It is also desired that the period of time needed for selecting the transmission rate be shorter.

SUMMARY OF THE INVENTION

Accordingly, it is an objective of the present invention to provide a malfunction diagnosis system that includes a plurality of electronic control units connected one another. At least one of the control units is adapted for a plurality of transmission rates.

To achieve the foregoing and other objectives and in accordance with the purpose of the present invention, a malfunction diagnosis system is provided. The system includes a plurality of electronic control units, a malfunction diagnostic tester and transmission rate selector. The electronic control units are connected with one another, thereby constituting a communications network. The malfunction diagnostic tester is connected to at least one of the control units and reads data related to malfunctions that is stored in the control unit. The diagnostic tester transmits a relatively slow initialization signal to the control unit connected thereto before starting data transmission with the unit. The transmission rate selector is incorporated in the control unit that is connected to the diagnostic tester. The transmission rate selector selects a transmission rate among a plurality of transmission rates for data transmission between the control unit and the diagnostic tester based on the received initialization signal.

Another objective of the present invention is to provide a malfunction diagnosis system including an electronic control unit adaptable for a plurality of transmission rates. The electronic control unit quickly selects a transmission rate among the plurality of transmission rates.

BRIEF DESCRIPTION OF THE DRAWINGS

The features of the present invention that are believed to be novel are set forth with particularity in the appended claims. The invention, together objects and advantages thereof, may best be understood by reference to the following description of the presently preferred embodiments together with the accompanying drawings in which:

DETAILED DESCRIPTION OF THE PREFERRED EMBODIMENTS

A malfunction detection system according to a first embodiment of the present invention will now be described with reference to FIGS. 1 to 4.

Figure 1:
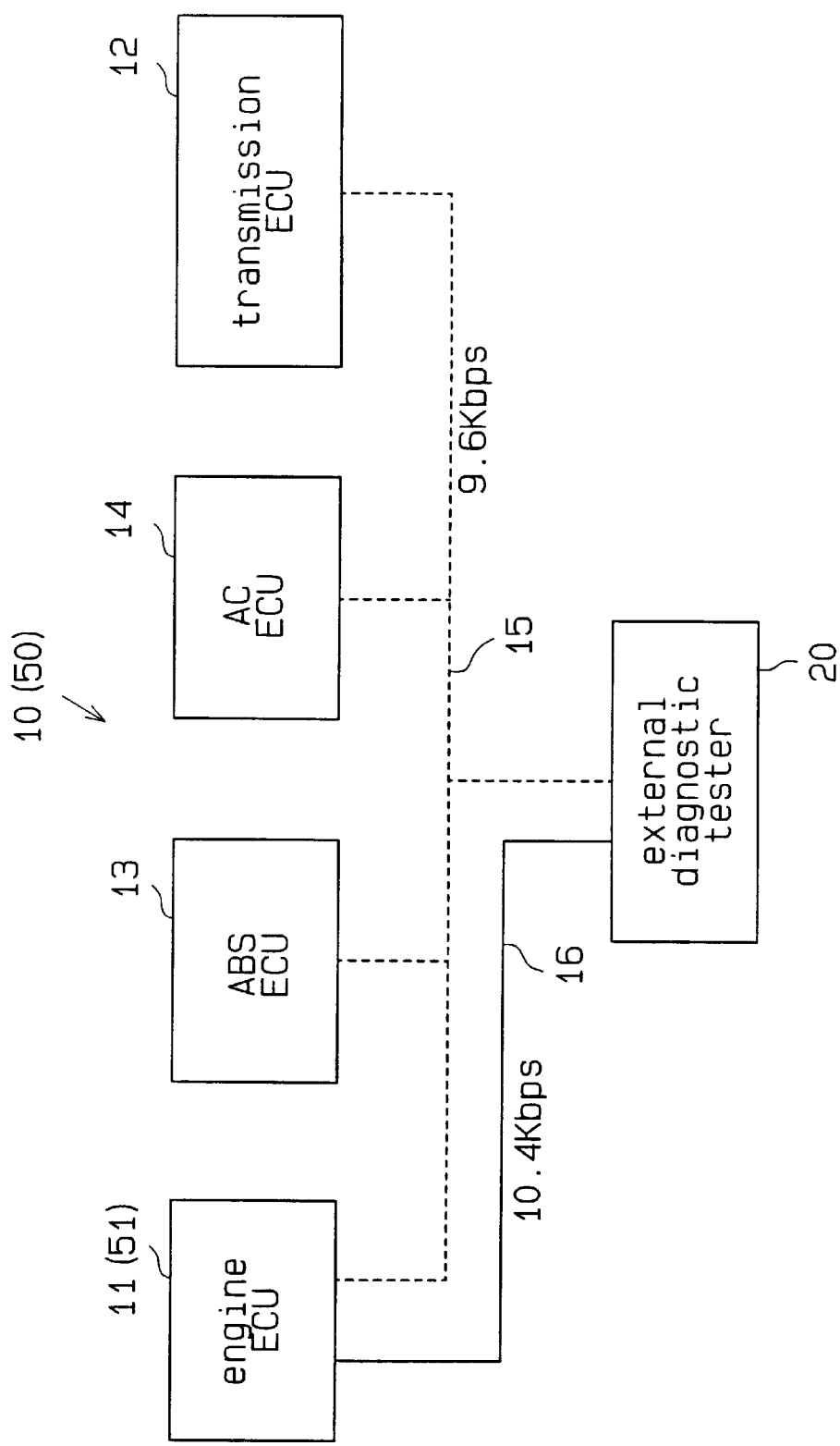
FIG. 1 is a block diagram illustrating a malfunction detection system for electronic control units mounted on a vehicle according to a first embodiment of the present invention.
Figure 2:
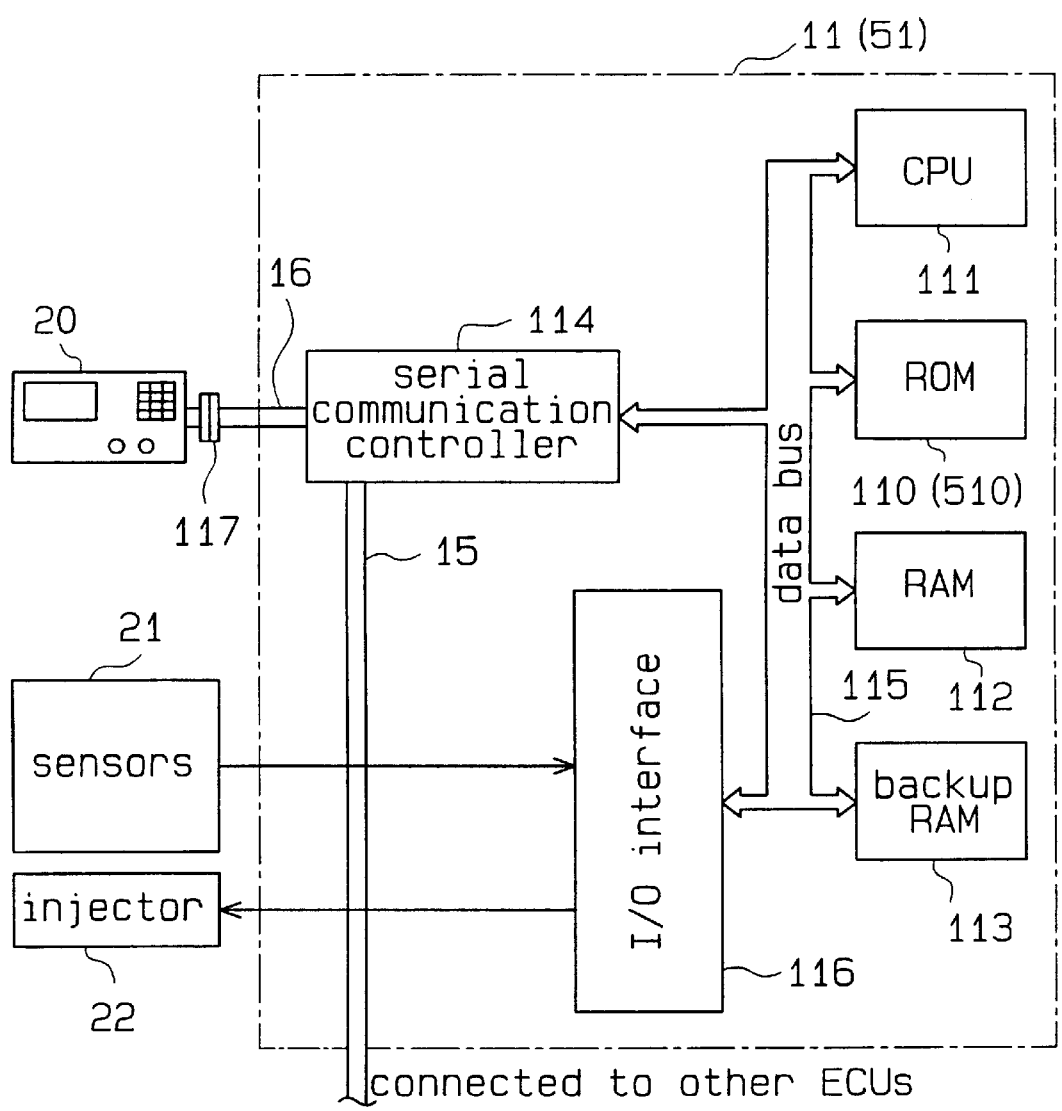
FIG. 2 is a block diagram illustrating an electronic control unit for controlling an engine.

FIG. 1 is a block diagram illustrating a system 10. FIG. 2 is a block diagram illustrating an electronic control unit (ECU) 11 for an engine.

As shown in FIG. 1, the system 10 includes a plurality of ECUs 11, 12, 13, 14 and an external vehicle diagnostic tester 20. The ECUs 11 to 14 control an engine, a transmission, an antilock brake system (ABS) and an air conditioner (AC), respectively. The ECUs 11 to 14 are connected with one another by a serial data bus 15, thereby constituting a local area network (LAN). As illustrated by broken lines in FIG. 1, signals (data) are transmitted among the ECUs 11 to 14 at 9.6 kbit/sec (kbps).

Each of the ECUs 11 to 14 has a diagnosis function for detecting abnormalities in itself and in the device it is connected to and each stores the abnormality data. The diagnostic tester 20 reads the abnormality data stored in the ECUs 11 to 14 and judges if there is a malfunction.

The diagnostic tester 20 is connected to the engine ECU 11, which functions as a master ECU, by a parallel data bus 16. When starting data transmission with the ECU 11, the diagnostic tester 20 sends an initialization signal at 5 bps, which is compliant with to ISO 9141. After the communication between the ECU 11 and the diagnostic tester 20 is established, the data transmission rate between the ECU 11 and the diagnostic tester 20 is set at 10.4 kbps to be compliant with the CARB regulations.

The circuitry of the engine ECU 11 will now be described with reference to FIG. 2. The ECU 11 includes a ROM 110, a RAM 112, a backup RAM 113, a CPU 111, a serial communication controller 114 and an input-output interface 116. The ROM 110 stores a first transmission rate selecting program and a fuel injection control program. The first transmission rate selecting program selects the transmission rate based on a device address signal from an external communication circuit. The fuel injection process program controls a fuel injection amount based on the running condition of the vehicle detected by sensors 21.

The CPU 111 performs computations based on control programs stored in the ROM 110. The RAM 112 temporarily stores the resultant data computed by the CPU 111 and data from the sensors 21. The backup RAM 113 retains necessary data when the engine (not shown) stops. The communication controller 114 converts the data format between parallel data and serial data.

The CPU 111, the ROM 110, the RAM 112, the backup RAM 113 and the serial communication controller 114 are connected with one another and to the I/O interface 116 by a bidirectional bus 115.

The sensors 21 are connected to the I/O interface 116. If data from the sensors 21 is analog, the data is converted into digital data by an analog-digital converter (not shown) in the interface 116. The converted data is outputted to the bidirectional bus 115.

External circuits such as an injector 22 are also connected to the I/O interface 116. The external circuits are controlled based on computation performed by the CPU 111.

The serial communication controller 114 has a connector 117 that is connectable to the diagnostic tester 20. The communication controller 114 converts parallel data from the external vehicle diagnostic tester 20 into serial data and converts serial data from the ECU 11 into parallel data.

Figure 3:
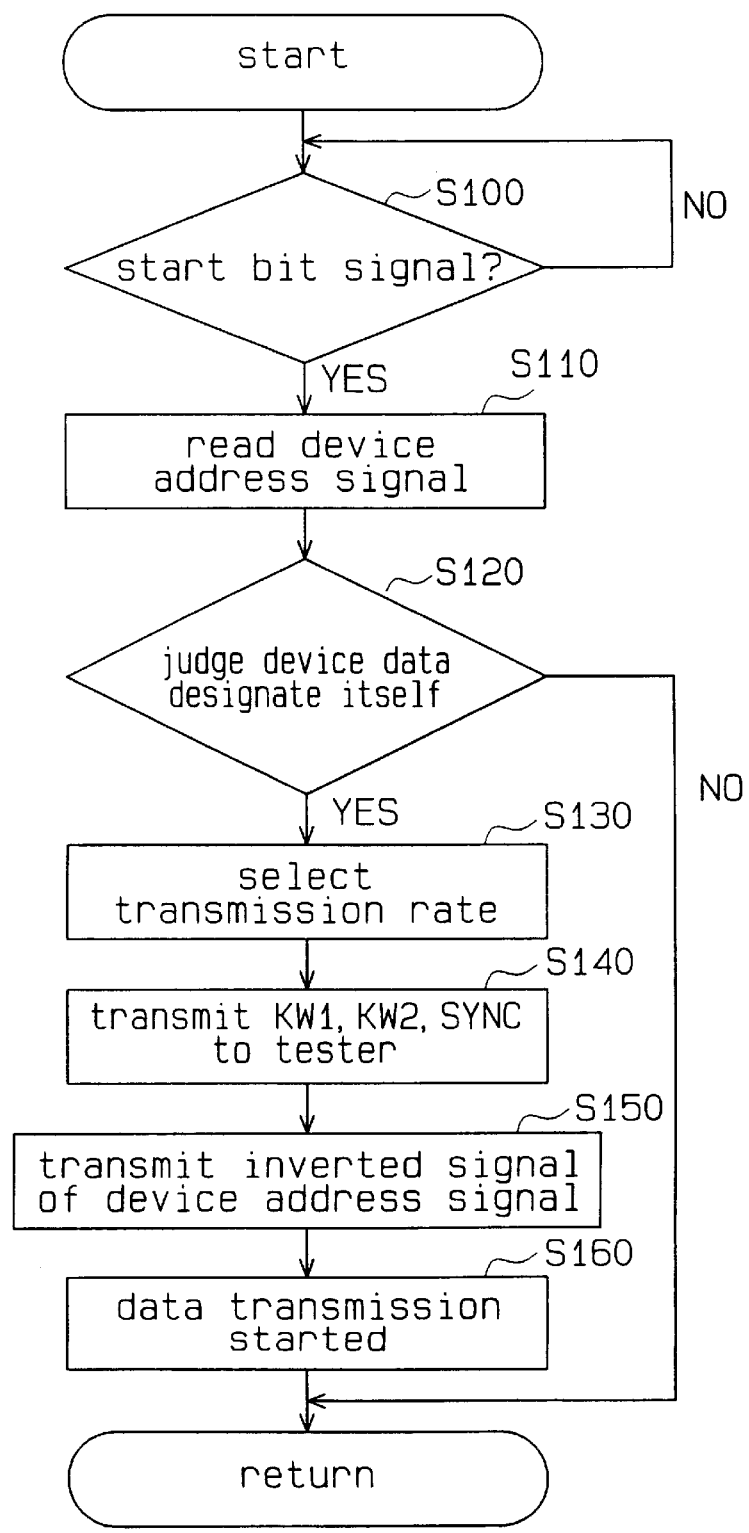
FIG. 3 is a flowchart showing a first transmission rate selecting process routine according to the first embodiment.
Figure 4:
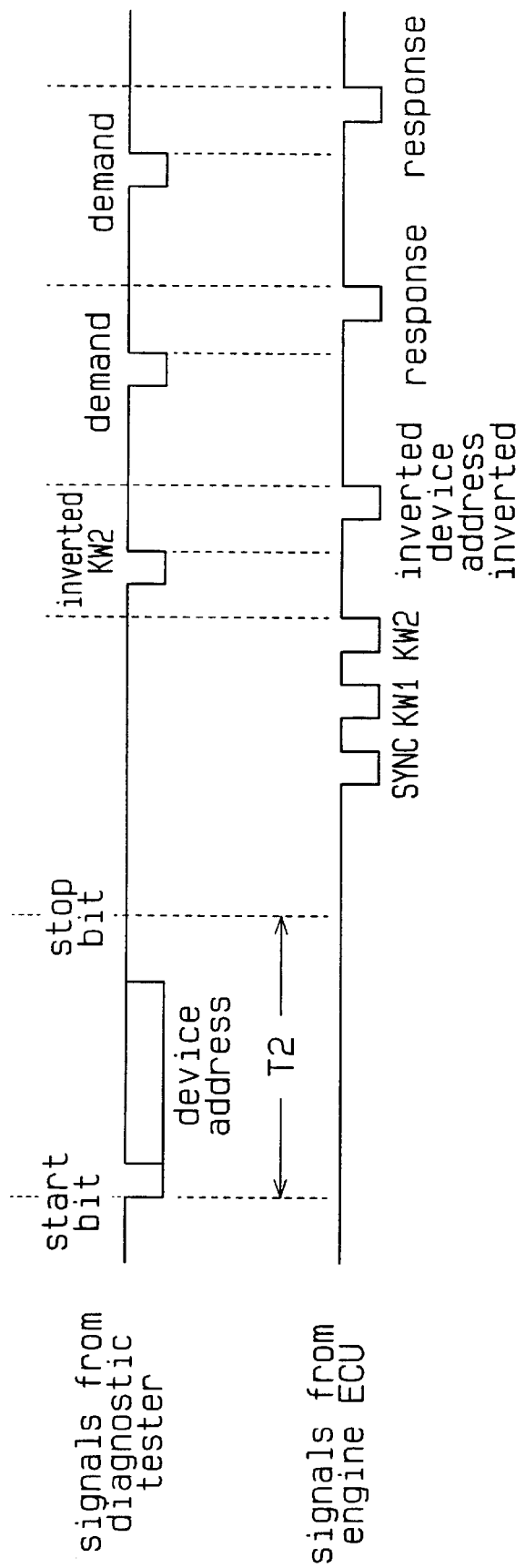
FIG. 4 is a timing chart showing the communication procedure between an external vehicle diagnostic tester and an electronic control unit for controlling an engine according to the first embodiment.

A transmission rate selecting procedure between the ECU 11 and the diagnostic tester 20 will be described with reference to FIGS. 3 and 4. In the flowchart of FIG. 3, "S" refers to a step. The procedure includes a initialization process between the ECU 11 and the diagnostic tester 20 performed by the ECU 11. FIG. 3 is flowchart showing a first transmission rate selecting routine performed by the engine ECU 11. FIG. 4 is a timing chart showing a communication procedure between the diagnostic tester 20 and the ECU 11.

The upper portion of FIG. 4 shows the waveform of signals outputted from the diagnostic tester 20 and the lower portion shows the waveform of signals outputted from the ECU 11. The diagnostic tester 20 first transmits a one bit start bit signal (low level signal) at 5 bps and then transmits an eight-bit device address signal (high level signal)for initialization also at 5 bps both via the serial communication controller 114. The device address signal indicates an address in the ROM 110. The ROM 110 has device data of an ECU that communicates with the diagnostic tester 20 and rate data indicating the transmission rate in the indicated address.

At this time, the ECUs 11 to 14 monitor the serial data bus 15. On detection of a start bit signal, each of the ECUs 11 to 14 reads an address signal (serial data) from the diagnostic tester 20. The ECUs 11 to 14 refer to the address in the ROM 110 indicated by the address signal. Each of the ECUs 11 to 14 judges whether it is designated by the device data stored in the address.

The external vehicle diagnostic tester 20 transmits a two-bit stop bit signal (high level signal) to the serial data bus 15 after transmitting the eight-bit device address signal. The period of time T2 for selecting the data transmission rate is 2 seconds.

A data transmission rate selecting routine will be described with reference to the flowchart of FIG. 3. It is assumed that data designating the ECU 11 is stored in the address indicated by the address signal and a data link is established between the ECU 11 and the diagnostic tester 20.

The ECU 11 monitors the serial data bus 15 until it detects a start bit signal (S100:NO). When the ECU 11 detects a start bit signal (S100:YES), it reads a device address signal (S110). The ECU 11 then refers to an address in the ROM 110 indicated by the address signal and judges whether the device data stored in the address designates the ECU 11 itself (S120).

If the ECU 11 judges the device data designates the ECU 11 itself (S120:YES), a data link is established between the ECU 11 and the diagnostic tester 20. If the ECU 11 judges the device data does not designate the ECU 11 itself (S120:NO), the ECU 11 stops the routine without performing the subsequent steps.

The ECU 11 refers to an address in the ROM 110 indicated by the address signal and acknowledges which data transmission rate (either 10.4 kbps or 9.6 kbps) the diagnostic tester 20 is demanding based on the data transmission rate data stored in the address. The ECU 11 then determines to perform data transmission with the diagnostic tester 20 at the selected data transmission rate (S130). When only communication between the diagnostic tester 20 an the ECU 11 is required, the diagnostic tester 20 transmits a device address signal demanding a transmission rate of 10.4 kbps to the ECU 11. On the other hand, when communication between the diagnostic tester 20 and the ECU 12, 13 or 14 is required, the diagnostic tester 20 transmits a device address signal demanding a transmission rate of 9.6 kbps.

Subsequently, the ECU 11 sends a synchronization signal SYNC for confirming the transmission rate and keyword signals KW1, KW2 to the diagnostic tester 20 (S140).

After receiving the signals SYNC, KW1, KW2, the diagnostic tester 20 transmits an inverted signal of the keyword signal KW2 to the ECU 11.

After receiving and acknowledging the inverted signal of the keyword signal KW2, the ECU 11 transmits an inverted signal of the device address signal to the diagnostic tester 20 (S150). The initialization process is thus finished. Therefore, the ECU 11 selects a desired transmission rate among a plurality of transmission rates, simultaneously the diagnostic tester 20 performs the initialization process of the ECUs 12, 13 14.

After the transmission rate is selected, a normal data transmission between the diagnostic tester 20 and the ECU 11 is started (S160). The diagnostic tester 20 transmits a request signal to the ECU 11 at the selected transmission rate for performing data transmission. The ECU 11 receives the request signal and transmits a response signal to the diagnostic tester 20 also at the selected transmission rate. Repetition of the signal transmission allows the diagnostic tester 20 to read data related to a malfunction stored in the ECU 11 and to diagnose the malfunction based on the data.

As described above, the malfunction diagnosis system according to this embodiment allows the ECU 11 having a single communication IC to be used with a plurality of transmission rates. Switching of data transmission rates is readily performed based on address signals. This enables manufacturing of general-purpose ECUs 11, thereby reducing the development expenses and costs of ECUs.

Further, this embodiment eliminates the necessity for selecting a type of ECU based on where the vehicle is manufactured and sold. For example, when a vehicle manufactured in North America is imported to Japan, the ECU diagnosis may be performed in Japan.

The system thus selects the data transmission rate between the ECU 11 and the diagnostic tester 20 while being compliant with a slow initialization process required by the ISO standards. Therefore, if vehicle communications products are required to be compliant with the ISO standards in the future, the ECU 11 according to this embodiment will satisfy the ISO standard without any alteration. The system of this embodiment can thus be widely applied to various kinds of vehicles without considering future trends of standardization.

Next, a malfunction detection system 50 according to a second embodiment of the present invention will now be described. The system 50 is compliant to ISO standards and is characterized by a second transmission selecting process routine for quickly selecting the transmission rate.

To avoid a redundant description, like or same reference numerals are given to those components that are like or the same as the corresponding components of the first embodiment.

Figure 5:
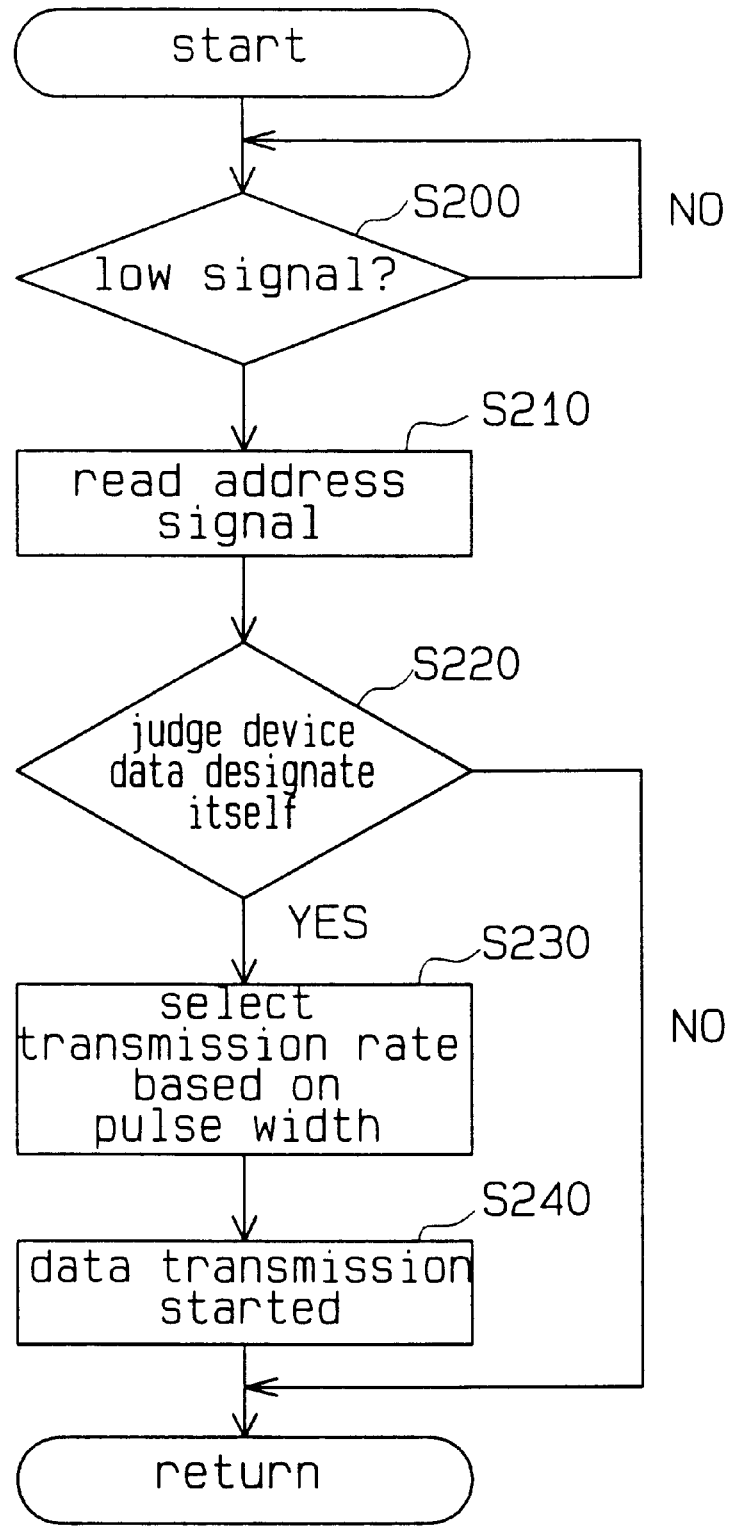
FIG. 5 is flowchart showing a second transmission rate selecting process routine according to a second embodiment of the present invention.

In this embodiment, an engine ECU 51 has a ROM 510. The ROM 510 has a second transmission rate selecting program as illustrated in FIG. 5. The transmission rate between the ECU 51 and the diagnostic tester is selected among 19.2 kbps, 10.4 kbps or 9.6 kbps.

Figure 6:
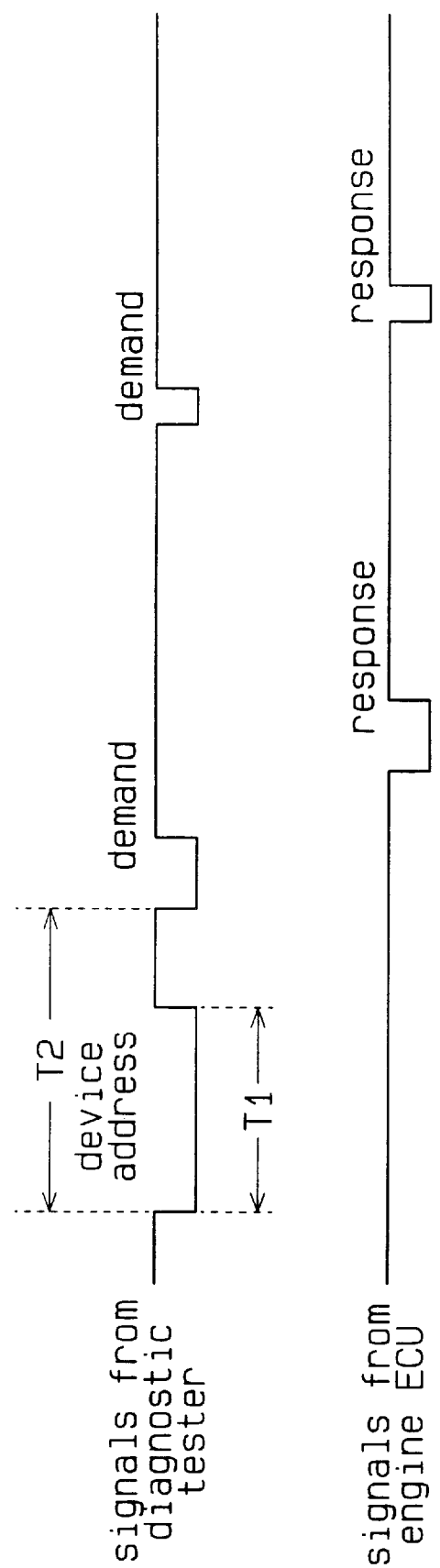
FIG. 6 is a timing chart showing the communication procedure between an external vehicle diagnostic tester and an electronic control unit for controlling an engine according to the second embodiment.

A process for selecting the transmission rate between the ECU 11 and the diagnostic tester 20 performed by the ECU 51 will be described with reference to FIGS. 5 and 6. The process includes the initialization process between the ECU 51 and the diagnostic tester 20 performed by the ECU 51. FIG. 5 is a flowchart showing the second transmission rate selecting process routine performed by the ECU 51. FIG. 6 is a timing chart showing a transmission process between the diagnostic tester 20 and the ECU 51. The upper half of FIG. 6 shows the waveform of signals transmitted from the diagnostic tester 20 and the bottom half shows the waveform of signals transmitted from the ECU 51.

As shown in FIG. 6, the diagnostic tester 20 transmits a device address signal (low level signal) for initialization to the serial data bus 15 via the serial communication controller 114 at 5 bps. At this time, the ECUs 12 to 14 and 51 monitor the serial data bus 15 and read a device address signal.

Each of the ECUs 12 to 14 and 51 judges whether it is designated by the read address signal. Either one of the ECUs 12 to 14 and 51 is designated based on the pulse width of the address signal. In this embodiment, the diagnostic tester 20 designates the ECU 51, which functions as a master ECU, by a device address signal in the initialization process. This establishes a data link between the ECU 51 and the diagnostic tester 20.

The ECU 51 monitors the serial data bus 15 until detection of a low level signal (S200:NO). When the ECU 51 detects a low level signal (S200:YES), it reads an address signal (S210). The ECU 51 then judges whether the address signal designates the ECU 51 itself (S220). If the ECU 51 judges that the address signal does not designate the ECU 51 itself (S220:NO), the ECU 51 stops the program without performing the subsequent steps.

If the ECU 51 judges the address signal designates the ECU 51 itself (S220:YES), a data link is established between the ECU 51 and the diagnostic tester 20. The ECU 51 then judges whether the diagnostic tester 20 is requesting a transmission rate of 19.2 kbps, 10.4 kbps or 9.6 kbps based on the pulse width of the address signal for selecting the transmission rate (S230).

The relationship between the pulse width of device address signals and transmission rates will now be explained. In this embodiment, the diagnostic tester 20 alters the pulse width of address signals depending on what transmission rate it is demanding. If the pulse width T1 is 100±2 msec, the ECU 51 selects a transmission rate of 9.6 kbps. If the pulse width T1 is 125±2 msec, the ECU 51 selects a transmission rate of 19.2 kbps. If the pulse width T1 is 175±2 msec, the ECU 51 selects a transmission rate of 10.4 kbps If the pulse width of address signals exceeds 200 msec (T2), the target ECU 51, 12, 13 or 14 and the transmission rate are selected based on an ISO-compliant method described in the first embodiment. The data transmission rate is thus kept at 5 bps.

As described above, the ECU 51 only needs to identify the pulse width T1 of the address signal. Therefore, even if initialized at an ISO-compliant 5 bps, the ECU 51 quickly selects the transmission rate.

After a predetermined period of time, data transmission between the ECU 51 and the diagnostic tester 20 is started at the transmission rate selected in the step 220 (S240). At 9.6 kbps, data transmission among the ECUs 51, 12, 13 and 14 are possible. At this transmission rate, data transmission is performed between the external vehicle diagnostic tester 20 and the ECUs that have established a data link. The diagnostic tester 20 diagnoses malfunctions based on diagnosis data stored in the ECUs.

In this embodiment, the ECU 51 selects the transmission rate based only on the pulse width of the address signal. Further, unlike the first embodiment, there is no acknowledge signal transmitted between the diagnostic tester 20 and the target ECU. This shortens the period of time needed for selecting the transmission rate to the pulse width of the address signal (approximately 100 msec to 175 msec). This speeding up of the process by requiring no acknowledge signal is possible because the number of the ECUs that communicate with the diagnostic tester 20 is limited. In comparison with the prior art system, in which it takes approximately 2 seconds to determine the transmission rate, this embodiment significantly reduces the required time. As a result, an ECU inspection is performed quickly enough not to affect other steps in factory inspections, where time management is a important factor and every millisecond counts.

Although only two embodiments of the present invention have been described herein, it should be apparent to those skilled in the art that the present invention may be embodied in many other specific forms without departing from the spirit or scope of the invention. Particularly, it should be understood that the invention may be embodied in the following forms.

The transmission between the ECU 11 and the diagnostic tester 20 may be performed at rates other than the above listed ones.

In the above embodiments, the diagnostic tester 20 transmits address signals to the ECUs 11 and 51 at 5 bps pursuant to ISO9141. However address signals may be transmitted at other rates. For example, if the ISO standard is changed, the transmission rate may be changed, accordingly.

In the above embodiments, the ECUs 11 and 51 function as a master ECU. However, another ECU 12, 13 or 14 may function as a master ECU if the transmission rate between the diagnostic tester 20 and the ECU 11 or 51 is 10.4 kbps.

The above embodiments may include other ECUs such as a cruise control ECU in addition to the ECUs 11, 12, 13, 14 and 51.

Therefore, the present examples and embodiments are to be considered as illustrative and not restrictive and the invention is not to be limited tot he details given herein, but may be modified within the scope and equivalence of the appended claims.

What is claimed is:

1. A diagnosis system for reading malfunction data from electronic control units used to control various functions of a vehicle, the system comprising:

a plurality of electronic control units forming a communications network, wherein each control unit of the plurality of electronic control units stores data related to malfunctions;

a diagnostic tester connected to the electronic control units via the communications network for reading the data stored in the electronic control units, wherein the diagnostic tester transmits an initialization signal at a predetermined low speed to the communications network when the diagnostic tester starts communicating with at least one of said electronic control units; and a selecting means located in at least one of the electronic control units for selecting a transmission rate between the communications network and the diagnostic tester from a plurality of transmission rates, that are faster than that of the initialization signal, based on a pulse width of the initialization signal.

2. The system according to claim 1, wherein said initialization signal is transmitted at a rate of approximately 5 bits per second.

3. The system according to claim 1, wherein the diagnostic tester is connected to a specific electronic control unit of the plurality of electronic control units, and the diagnostic tester communicates with the specific electronic control unit at a high rate after the diagnostic tester transmits the initialization signal.

4. The system according to claim 1, wherein the initialization signal includes device data for selecting one of the electronic control units to communicate with the diagnostic tester.

5. A method for reading malfunction data from electronic control units used to control various functions of a vehicle, the electronic control units forming a communications network, wherein the diagnostic tester is connected to the electronic control units via the communications network, the method comprising the steps of:

transmitting an initialization signal from the diagnostic tester to at least one of said electronic control units at a predetermined low speed;

selecting a transmission rate between the diagnostic tester and the at least one of said electronic control units from a plurality of transmission rates, that are faster than the transmission rate of the initialization signal, based on a pulse width of the initialization signal; and performing a communication between the diagnostic tester and the at least one of the electronic control units at the selected rate.

6. A diagnosis system for reading malfunction data from an electronic control unit used to control various functions of a vehicle, wherein the electronic control unit stores data related to malfunctions, the system comprising:

a diagnostic tester connected to the electronic control unit for reading the data stored in the electronic control unit, wherein the diagnostic tester transmits an initialization signal at a predetermined low speed to the electronic control unit when the diagnostic tester starts communicating with the electronic control unit; and a selecting means located in the electronic control unit for selecting a transmission rate between the electronic control unit and the diagnostic tester from a plurality of transmission rates that are faster than that of the initialization signal, based on a pulse width of the initialization signal.

* * * * *